United States Patent [19]

Confalonieri et al.

[11] Patent Number: 4,805,192
[45] Date of Patent: Feb. 14, 1989

[54] METHOD AND APPARATUS FOR PULSE CODE MODULATION COMBINATION CHIP HAVING AN IMPROVED AUTOZERO CIRCUIT

[75] Inventors: Pierangelo Confalonieri, Canonica d'Adda, Italy; Daniel Senderowicz, Berkeley, Calif.; Augusto Tirelli, Roma, Italy

[73] Assignee: SGS Microelecttronica S.p.A., Agrate, Italy

[21] Appl. No.: 936,369

[22] Filed: Dec. 1, 1986

[30] Foreign Application Priority Data

Dec. 19, 1985 [IT] Italy ................ 23295 A/85

[51] Int. Cl.$^4$ ............ H04B 14/04; H03M 1/12
[52] U.S. Cl. ....................... 375/25; 341/118
[58] Field of Search ............. 375/25, 19, 30; 340/347 CC; 332/11 R, 11 D; 371/55

[56] References Cited

U.S. PATENT DOCUMENTS

| | | | |
|---|---|---|---|
| 3,800,236 | 3/1974 | Riethmuller et al. | 340/347 CC |
| 3,824,481 | 7/1974 | Sponholz et al. | 340/347 CC |
| 4,097,860 | 6/1978 | Araseki et al. | 340/347 CC |
| 4,193,039 | 3/1980 | Massa et al. | 340/347 CC |
| 4,380,005 | 4/1983 | Debord et al. | 340/347 CC |
| 4,384,278 | 5/1983 | Benjamin | 375/30 |

Primary Examiner—Benedict V. Safourek
Assistant Examiner—Andrew J. Telesz, Jr.
Attorney, Agent, or Firm—Victor Flores

[57] ABSTRACT

In a Pulse Code Modulated (PCM) circuit chip, apparatus in the transmit path to compensate for an offset voltage signal from a band-pass filter includes an up-down counter which is actuated to provide a digital value equivalent to the offset signal and a digital to analog converter coupled to the counter to provide an analog signal representing the digital value in the counter. During an initialization phase, the counter is incremented until the digital value of the counter provides, by means of the digital to analog converter, an analog signal that compensates for the off-set signal. After the initialization phase when the band-pass filter's offset voltage is compensated, then other circuitry including an exclusive OR gate and an associated overflow counter are used to eneable or disable the up-down counter to insure that the PCM output signal is an accurate representation of the analog input signal. The up-down counter, during the operation phase following the initialization phase, is only enabled when the analog input signal is not present.

4 Claims, 2 Drawing Sheets

METHOD AND APPARATUS FOR PULSE CODE MODULATION COMBINATION CHIP HAVING AN IMPROVED AUTOZERO CIRCUIT

BACKGROUND OF THE INVENTION

1. Field of the Invention

This invention relates generally to communication circuits and, more particularly, to a circuit on a semiconductor chip used in pulse code modulation (PCM) communication systems typically referred to as a PCM Combo Chip.

2. Discussion of the Related Art

A pulse code modulation telephone system can be considered as consisting of two basic paths. The first path is a transmit path in which the two main elements are a band-pass filter in the frequency range of 300 Hertz to 3400 Hertz, and an analog-to-digital (encoder) converter. The second path is the receive path and has a first stage of a digital-to-analog (decoder) converter followed by a low pass filter with a cut-off frequency of 3400 Hertz. In the technology of communication circuits, the combination chip or combo-chip is a name used for an integrated circuit which includes the circuit components for both the transmit path and the receive path.

A problem which can arise in devices implementing the combination chip is a conversion error produced in the transmit path resulting from an inherent DC voltage offset in the band-pass filter output signal. A DC voltage offset in the filter output signal is encoded as information containing signals and are consequently detected as an error signal in the encoded transmitted signal. To minimize the source of this error, systems specifications such as the CCITT and the AT&T specifications, limit the allowable error to values below seven millivolts. However, the seven millivolt figure can be substantially below the errors actually found in devices using the present technology. A need for reducing the error signals below value of the current specifications therefore becomes important for communication systems.

Referring first to FIG. 1, a procedure currently in use for reducing the DC voltage offset in a PCM transmit path is shown. This solution can be described as the integral of the sign bit and provides a cancellation of the system DC voltage offset for the pulse code modulation output signal. An analog input signal is applied to filter 11 only after the initialization phase, but during the initialization phase the analog input signal is internally grounded.

During the initialization phase, the output signal from filter 11 is combined in combination circuit 11a with a signal from integrating circuit 13 and is applied to analog-to-digital converter 12. The output signal of the analog-to-digital converter 12 is the pulse code modulation output signal with the sign of the output signal being applied to an input terminal of the integrating circuit 13. An understanding of how this circuit can operate can be provided by consideration of the circuit signal as a function of time shown in FIG. 2. FIGS. 2b, 2c and 2d illustrate what happens to the circuit of FIG. 1 at certain time intervals thereof after the identification of the presence of an offset voltage shown in FIG. 2a. Because of the presence of a positive signal at the output of the A to D converter 12, a positive sign bit signal is applied to the input of the Integration Circuit 13 which operates, upon receipt of a positive sign bit signal to reduce the Integration Circuit Output Signal (shown in FIG. 2b) one level. Thus, the reduced Integration Output Signal resulting from the application of the positive sign bit signal to the input of the Integration Circuit 13 causes the input signal to the A to D Converter 12 (see FIG. 2b) to be correspondingly reduced each time that the Integration Output Signal is reduced (see FIG. 2b). Accordingly, there reaches a point in time when by this technique the Integration Output Signal reaches a low value that causes the received A to D Converter Input Signal to generate a negative sign bit signal (which is shown as a "0" bit signal in FIG. 2d). This causes the Integration Circuit 13 to generate an increased output voltage which then causes the input to the A to D Converter 12 to get more positive thereby generating an output positive sign bit signal (a "1" bit signal shown in FIG. 2d) which is part of the alternate positive-negative sign bit signals indicating that compensation of the voltage offset from the Filter 11 has been achieved.

Referring to FIG. 3, a prior art circuit for implementing the Integrating Circuit 13 of FIG. 1 is shown. The sign bit signal is applied to a Select Circuit 31 that selects either a positive or a negative reference voltage i.e. $+V_R$ or $-V_R$ and applies this voltage to the output terminal of the Select Circuit 31, which is the Input for the equation shown in FIG. 3. Capacitor C1 which has been discharged to ground by switch 32, is now coupled between the Select Circuit 31 and the inverting terminal of operation amplifier 33. The non-inverting terminal of amplifier 33 is coupled to ground potential. The $+V_R$ or $-V_R$ voltage at the output terminal of Select Circuit 31 generates an output signal to 11a according to the equation shown in FIG. 3. C1 is much smaller than C2 in order to generate the smallest change in the degree of change in the Integration Circuit Output Signal (see FIG. 2b) in order to reduce the effects of a distortion or error signal that is generated on the receipt of the integration output signal at the Filter 11. In this way, the value of the voltage at the output terminal of operational amplifier 33 will gradually approach the value for compensating the offset output signal of Filter 11.

After initialization, an Analog Input Signal is applied to the Filter 11. However, in the prior art circuit of FIGS. 1 and 3, there is a problem in generating a PCM output Signal that is always an accurate representation of the analog Input Signal. For example, if the Analog Input Signal applied to the Filter 11 after initialization is perfectly sinusoidal (where the mean value is zero or the amount of the positive portion of the sinusoidal analog input signal is equal to the negative portion of the sinusoidal analog input signal), then the prior art circuit can generally generate a PCM Output Signal that is a representation of the Analog Input Signal (except for the inherent distortions created by the Integration Circuit 13 during the positive and negative cycle swings of the sinusoidal Analog Input Signal) that is applied to the Filter 11. However, for those situations (such as in some voice type signals) where the Analog Input Signal has either a negative portion (or a positive portion) of its wave form that is longer in time than its corresponding positive (or negative) portion of its wave form, then the distortion that is created by virtue of the operation of the Integration Circuit 13 to generate increased voltage signals for the longer period negative portion of the wave form (or reduced voltage signals for the longer period positive portion of the wave form)

causes the PCM Output Signal to be distorted and not be a true representation of the analog Input Signal.

A need has therefore been felt for an improved Pulse Code Modulation circuit that can overcome the above identified problems with the prior PCM circuits. Also, there is a need for providing an improved PCM circuit that can operate during those periods of time when there is not Analog Input Signal.

SUMMARY OF THE INVENTION

It is an object of the present invention to provide an improved Pulse Code Modulation combination chip circuit.

It is a further object of the present invention to provide an improved PCM combination chip circuit that also compensates for the offset voltage of the pass-band filter in the transmit path.

It is yet another object of the present invention to provide an improved PCM circuit for compensating for a changing offset voltage from the filter that can vary because of changing temperature without affecting the output PCM signal.

The aforementioned and other objects are accomplished, according to the present invention, by a circuit that detects and stores digitally the value of the system offset in an initialization process. This offset value remains constant in the presence of a signal. In order to compensate for long term variations in the system offset apparatus is provided for detecting the absence of an input analog signal. In the absence of an input analog signal, the value for correcting for the offset voltage stored in the dedicated register (Up-Down Counter) can be updated. In every frame, the value stored in the register (Up-Down Counter) is added, after a digital-to-analog conversion, to the input signal at the summing node of the analog-to-digital converter.

These and other features of the present invention will be understood upon reading of the following description along with the figures.

DESCRIPTION OF THE PREFERRED EMBODIMENT

Detailed Description of the Figure

Figure 1:
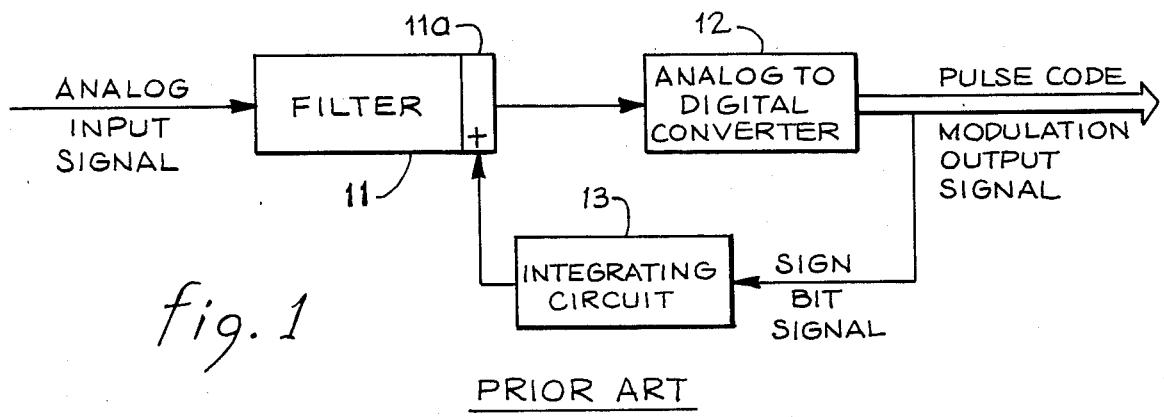
FIG. 1 is a block diagram of a prior art solution to compensation of the band-pass filter offset signal.
Figure 2:
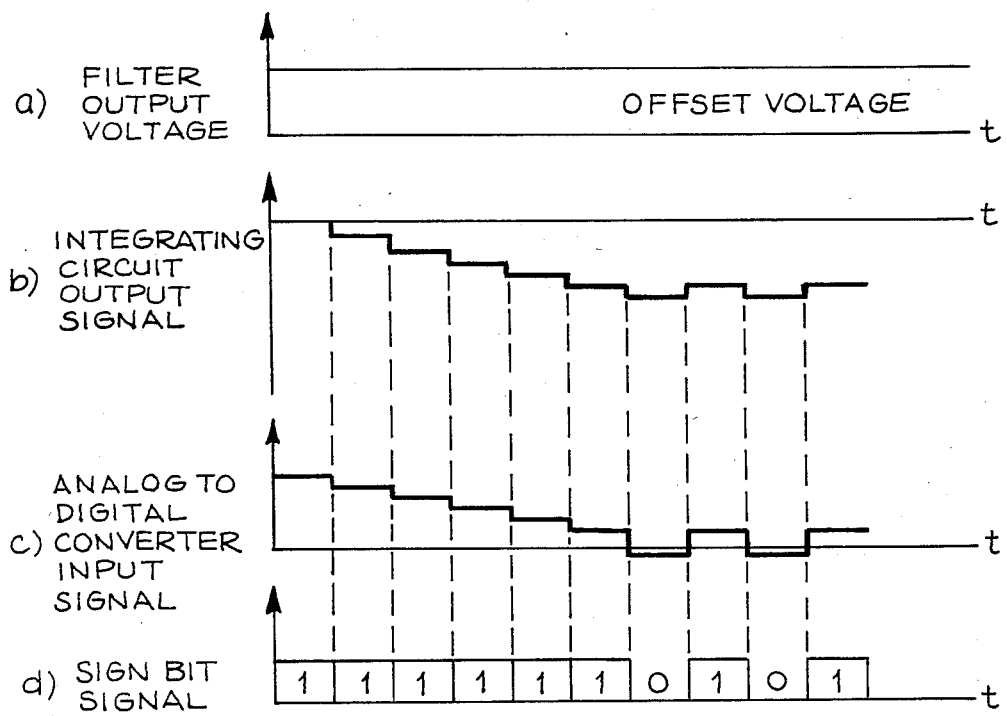
FIGS. 2a-2d are representation of wave forms present at nodes in FIG. 1 illustrating the band-pass filter off-set correction during the initialization phase.
Figure 3:
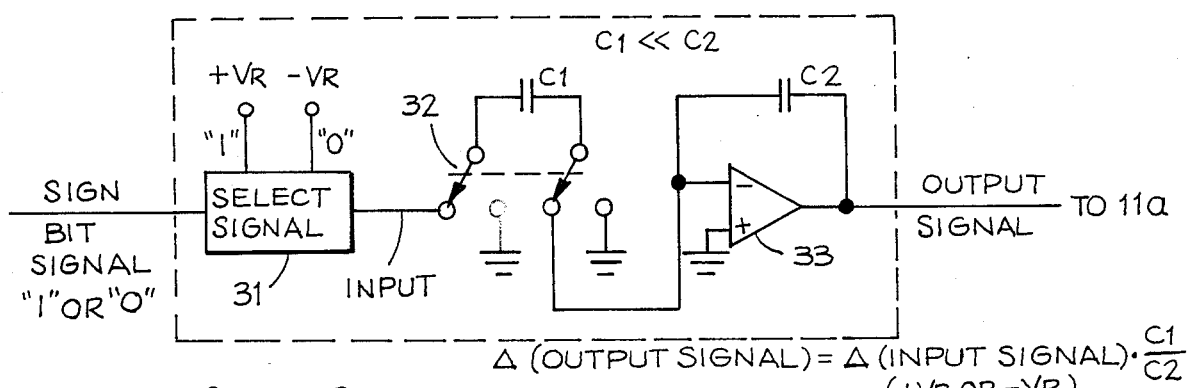
FIG. 3 shows a block diagram of a prior art switch capacitor integrator capable of implementing the integrating circuit of FIG. 1.
Figure 4:
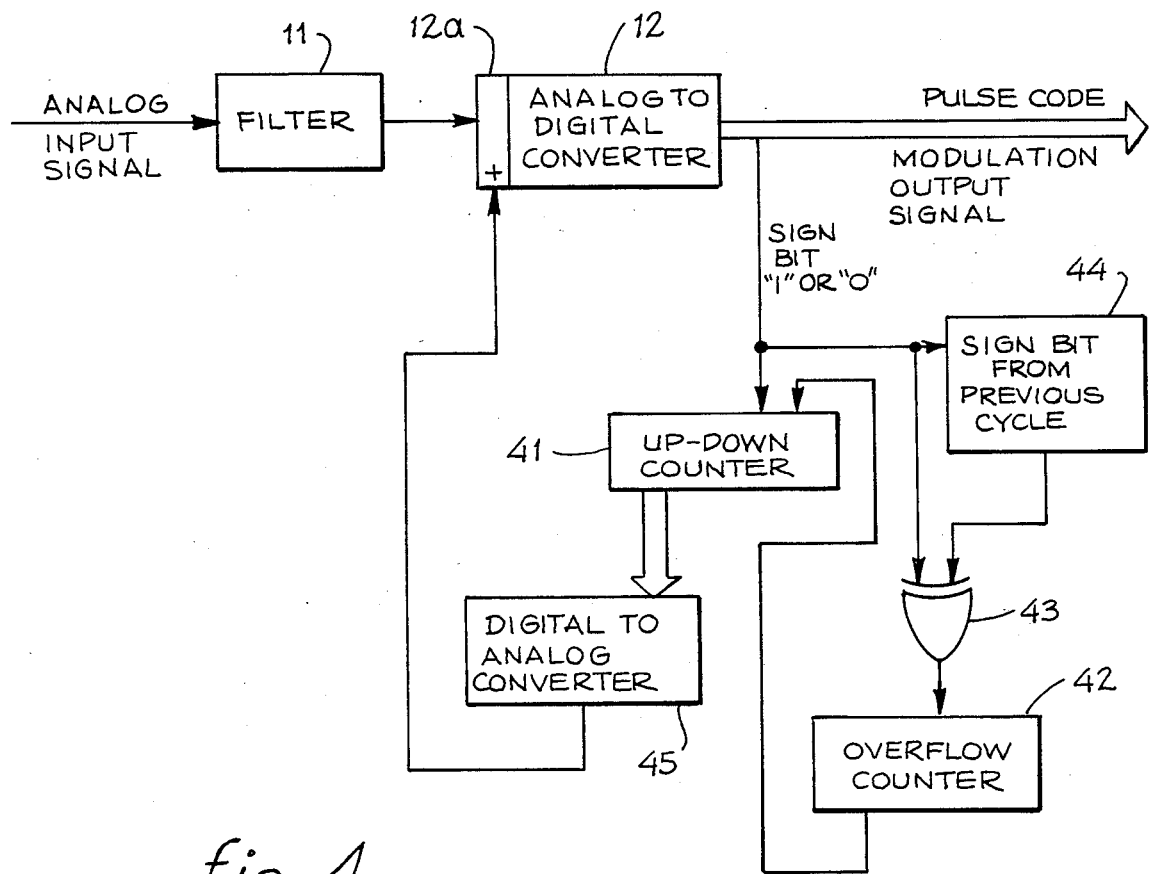
FIG. 4 is a block diagram of the autozero offset voltage apparatus according to the present invention.

Referring next to FIG. 4, an analog input signal is applied to band-pass filter 11. An output signal from filter 11 is applied to a summing node associated with combination circuit 12a associated with analog-to-digital converter circuit 12. Output signal of the analog-to-digital converter 12 is the pulse code modulation output signal of the circuit. The sign from the pulse code modulation output signal is applied to up-down counter 41 and is applied to logic exclusive OR gate 43 and to a circuit 44 for storing the sign bit from the previous cycle. When the sign bit from the previous cycle stored in apparatus 44 and the sign bit applied to the other terminal of logic exclusive OR gate 43 are the same, the Overflow Counter 42 increments one count. When this occurs for 32 successive comparisons, then the Overflow Counter 42 produces a "1" signal bit at its output which is an enable signal to restart the Up-Down Counter 41 and to update the contents thereof. Should there be two different signals at the inputs of the exclusive OR gate 43 prior to reaching the 32 successive same comparisons, then the Overflow Counter 42 is reset to zero. There is an automatic reset to zero for the Overflow Counter 42 for Analog Input Signals over 300 Hz because signals of these frequencies cannot produce 32 successive equal inputs to the exclusive OR gate 43. If desired, the number 32 of successive equal inputs to the exclusive OR gate 43 can be lowered or increased according to the particular application. The contents of up-down counter 41 is applied to digital to analog converter 45 and then applied to the combination circuit 12a for providing compensation for the offset signal from pass-band filter 11.

Operation of the Preferred Embodiment

During the initialization phase in which no input signal is applied to band-pass filter 11, the Pulse Code Modulation output signal sign is applied to up-down counter 41 in the appropriate direction until the offset voltage from filter 11 is compensated by the contents of the up-down counter 41.

Once the up-down counter 41 is initialized, then no activity with respect to updating the counter will be taken as long as an analog input signal is applied to filter 11. In order to determine how and when an analog input signal is not present, an arbitrary (but higher than a minimum number, for example, 27 for a 300 Hz analog input signal) number of constant sign bits must be identified. Apparatus 44 of FIG. 4 stores the sign bit applied from the previous cycle and that sign bit is compared with the sign bit of the present cycle. When the inputs are the same for a predetermined (i.e. 32) number of cycles as determined by overflow counter 42, the presumption is made that an analog input signal is not present and the output of the overflow counter 42 is used to vary the content of the up-down counter 41 until the inputs to the exclusive OR gate 43 are different.

In summary, during the initialization phase, only the loop comprising the up-down counter 41 and the D to A Converter 45 is operative to compensate for the offset voltage appearing at the output of the Filter 11. During the operation phase, then the remaining portions of the circuit shown in FIG. 4 become operative and cooperate together as described above to provide an accurate PCM Output Signal regardless of the nature of the Analog Input Signal.

It will be clear that the interaction of the compensating signals does not occur when the analog input signal is present. Furthermore, it will be clear that the counter can serve as a long-term memory apparatus for storing the value of a correction signal without the requirement for up-dating the signal.

The foregoing description is included to illustrate the operation of the preferred embodiment and is not meant to limit the scope of the invention. The scope of the invention is to be limited only by the following claims. From the foregoing description, many variations will be apparent to one skilled in the art that would yet been compassed by the spirit and scope of the invention.

What is claimed is:

1. The method for correcting for an off-set signal, said method comprising the steps of:
   (a) receiving an offset signal by an analog-to-digital converter from a circuit element generating said off-set signal;
   (b) generating sign output signals by said analog-to-digital converter corresponding to the sign of said offset signal;
   (c) comparing signs of said sign output signals;
   (d) changing a value in a first and second counter in response to detecting, in said comparing step, an accordance of the same signs of said generated sign output signals;
   (e) creating an analog signal equivalent of said changed value in said second counter;
   (f) combining said analog signal equivalent of said second counter with said off-set signal at a summing node of said analog- to digital converter;
   (g) generating a reduced input off-set signal for inputting to said analog-to-digital converter;
   (h) repeating said receiving step;
   (i) disabling said second counter from incrementing contents when said comparing step indicates detection of different signs of said sign output signals; and
   (j) continuously applying said analog signal equivalent to said summing node of said analog-to-digital converter, thereby correcting for said off-set signal.

2. The method for correcting for an off-set signal of claim 1 wherein, said step of changing a value in a first and second counter is in response to said first counter having changed content value a predetermined number of times.

3. Apparatus for correcting an off-set signal combined with an input signal, said apparatus comprising:
   (a) sign means for determining a sign of a combined input signal applied thereto, said sign means comprising an analog-to-digital converter, said combined input signal comprising said input signal, said off-set signal and an analog signal;
   (b) storage means for changing a value stored therein in response to said sign means when said input signal is absent from said combined input signal, said storage means including comparison means for comparing an incoming sign signal with a sign signal from a previous period, wherein said comparison means provides for updating of said storage means value after said comparison means has compared said incoming sign signal and said sign signal from a previous period as having equivalent signs a predetermined number of times, said storage means comprises an up-down counter for storing said value; and
   (c) conversion means for providing said analog signal in response to said storage means value, said analog signal being combined with said input signal and said off-set signal.

4. Apparatus for providing a pulse code modulated output signal that is an accurate representation of a band pass analog input signal comprising:
   (a) an analog-to-digital converter coupled to said band pass analog input signal, said analog-to-digital converter generating consecutive sign output signals comprising constant sign output signals corresponding to the absence of said band pass analog input signal and consecutive and variable sign output signals corresponding to the presence of said band pass analog input signal;
   (b) counter means coupled to said analog-to-digital converter for receiving said consecutive sign output signals from said analog-to-digital converter, said consecutive sign output signals being a first input signal into said counter means;
   (c) circuit means also coupled to said analog-to-digital converter for receiving, storing, and comparing signs of said consecutive sign output signals from said analog-to-digital converter, said circuit means being designed to generate a second input signal for said counter means, said second input signal for said counter means comprising:
      (i) an enabling input signal for said counter means upon said circuit means detecting that said consecutive sign output signals from said analog-to-digital converter have occured constantly without sign change for a set number of periods, and
      (ii) a disabling input signal for said counter means upon said circuit means detecting a change in sign of said consecutive sign output signals from said analog-to-digital converter,
      said enabling input signal causing said counter means to restart and update contents and said disabling input signal not affecting contents of said counter means,
      said enabling input signal continuously updating said contents of said counter means during an initialization phase when said band pass analog input signal is not present and thus causing said counter means to continuously store an analog correction signal representation of an offset voltage; and
   (d) digital-to-analog converter means coupled to said counter means for applying said analog correction signal contained in said counter means to said analog-to-digital converter, said applying of said analog correction signal occuring continuously during presence of said band pass analog input signal, said disabling input signal being continuously generated during a normal operation phase when said band pass analog input signal is present, said counter means maintaining contents from said initialization phase during said normal operation phase and thereby providing a modulated pulse code that is an accurate representation of a band pass analog input signal.

* * * * *